United States Patent [19]

Kunugi et al.

[11] Patent Number: 4,868,878
[45] Date of Patent: Sep. 19, 1989

[54] SOUND FIELD CORRECTION SYSTEM

[75] Inventors: Yoshiro Kunugi; Akio Tokumo; Toshikazu Yoshimi; Yoshio Sasaki; Shinjiro Kato; Shuuichi Mori; Makoto Odaka; Takeshi Sato, all of Saitama, Japan

[73] Assignee: Pioneer Electronic Corporation, Tokyo, Japan

[21] Appl. No.: 77,071

[22] Filed: Jul. 28, 1987

Related U.S. Application Data

[63] Continuation of Ser. No. 721,354, Apr. 9, 1985, abandoned.

[30] Foreign Application Priority Data

| | | |
|---|---|---|
| Apr. 9, 1984 [JP] | Japan | 59-70543 |
| Apr. 9, 1984 [JP] | Japan | 59-70544 |
| Apr. 18, 1984 [JP] | Japan | 59-78237 |
| Apr. 18, 1984 [JP] | Japan | 59-78238 |
| Apr. 18, 1984 [JP] | Japan | 59-78239 |
| Apr. 18, 1984 [JP] | Japan | 59-78240 |
| May 31, 1984 [JP] | Japan | 59-80551[U] |
| May 31, 1984 [JP] | Japan | 59-80565 |

[51] Int. Cl.[4] .............................................. H04S 1/00
[52] U.S. Cl. .................................................... 381/1
[58] Field of Search ................................ 381/1, 17, 63

[56] References Cited

U.S. PATENT DOCUMENTS 4,308,423 12/1981 Cohen ...................................... 381/1
4,309,570 1/1982 Carver ..................................... 381/1

Primary Examiner—Forester W. Isen
Attorney, Agent, or Firm—Sughrue, Mion, Zinn, Macpeak & Seas

[57] ABSTRACT

A sound field correcting system for correcting for multipath frequency-characteristic distortion in an acoustic reproducing system. In one embodiment, the level and delay of an original signal are adjusted and superposed on the original signal so as to obtain a signal which, when reproduced by a loudspeaker, yields a sound pattern at a listening point having a flat frequency characteristic. The delay adjustment is effected in accordance with a difference between the travel distances of direct and reflected sound waves to the listening point.

2 Claims, 13 Drawing Sheets

SOUND FIELD CORRECTION SYSTEM

This is a continuation of application Ser. No. 721,354, filed Apr. 9, 1985 now abandoned.

BACKGROUND OF THE INVENTION

The present invention relates to a sound field correcting system, and more particularly to a system for correcting the sound field at a predetermined listening point in the sound field receiving both sound waves radiated directly by a loudspeaker and reflected sound waves.

A typical example of an acoustic reproducing system is shown in FIG. 1. In FIG. 1, a reproducing signal outputted by a magnetic tape recording head 1-1 is amplified by a reproducing amplifier 1-2 and is then applied to a frequency characteristic adjusting amplifier 1-3. The output of the amplifier 1-3, after being subjected to power amplification by a loudspeaker drive amplifier 1-4, drives a loudspeaker 1-5.

In this system, the signal provided by the reproducing head 1-1 is converted into a signal having a desired frequency response characteristic and amplified by the reproducing amplifier 1-2. In the following stage, the frequency characteristic adjusting amplifier 1-3, for instance, a graphic equalizer or bass/treble control, converts the output signal of the amplifier 1-3 into a loudspeaker drive signal having a desired reproduction frequency characteristic.

In such an acoustic system, as shown in FIG. 2, a sound wave radiated by the loudspeaker 1-5 advances along two paths to reach a listening point (position) in the sound field. That is, at the listening point there are received both a direct sound wave (as indicated by the solid line 1-7) and a sound wave reflected from a wall or the like (as indicated by the dotted line 1-8). In this case, at the listening point 1-6, the two sound waves interfere with each other, as a result of which peaks and dips occur in the frequency characteristic so that the frequency response is made undesirable. In order to compensate for such an undesirable frequency response, the graphic equalizer 1-3 or the like is employed.

The reason why such peaks and dips occur in the frequency characteristic will be briefly described.

It is assumed that, in FIG. 2, the distance of the direct sound wave's path 1-7 to the listening point 1-6 is represented by $L_1$, the distance of the reflected sound wave's path 1-8 to the listening point 1-6 is represented by $L_2$, and the sound velocity is represented by c. Then, the sound $S_M$ at the listening point is the sum of the direct sound wave $S_S$ and the reflected sound wave $S_R$:

$$S_M = S_S + S_R \quad (1\text{-}1)$$
$$= (A/L_1)e^{j\omega}(t - L_1/c) +$$
$$(KA/L_2)e^{j\omega}(t - L_2/c),$$

where K is the reflection factor of a wall or the like and A is the signal strength at the surface of the loudspeaker. As for the reflected sound wave $S_R$, it can be considered that the reflection is a so-called rigid edge in almost all cases, because the acoustic impedance of the wall is higher than that of air. It can be considered that the reflection takes place without change of phase. (In the case of a free edge reflection, the acoustic impedance is low, and $S_M = S_S - S_R$.)

Expression (1) can be rewritten as follows:

$$S_M = (A/L_1)[e^{j\omega(t-L_1/c)} + Be^{j\omega(t-L_2/c)}], \quad (1\text{-}2)$$

where $B = KL_1/L_2$.

If, for simplification of description, B is set to 1, the frequencies f where peaks occur are:

$$f = nc/(L_2 - L_1). \quad (1\text{-}3)$$

The frequencies f where dips occur are:

$$f = (n + \tfrac{1}{2})c/(L_2 - L_1). \quad (1\text{-}4)$$

Plots of expressions (1-3) and (1-4) are shown in FIG. 3. In practice, $B \neq 1$. Therefore, the sound pressure at dip frequencies cannot be zero and $S_M$ cannot be precisely equal to $2A/L_1$ at the peak frequencies. In FIG. 3, the broken line indicates the results in the case of free edge reflections merely for reference.

Further, it is assumed that the transfer function of the path of a direct wave 1-7 is represented by $G_1(s)$ and the transfer function of the path of a reflected sound wave 1-8 is represented by $G(\tau) \cdot G(k) \cdot G_2(s)$, where $G_1(s)$ and $G_2(s)$ are transfer functions which depend on the lengths of the paths, $G(\tau)$ indicates the phase and delay time which depend on the difference in distance, and $G(k)$ indicates a reflection condition such as a reflection factor.

The transfer function $G_A(s)$ between the loudspeaker 1-8 and the listening point is as follows:

$$\begin{aligned} G_A(s) &= G_1(s) + G(\tau)G(k)G_2(s) \\ &= G_1(s)(1 + G(\tau)G(k)G_2(s)/G_1(s)) \end{aligned} \quad (8\text{-}1)$$

That is, due to the factor $G(\tau)$, which is a function of the difference in travel distance between the two sound waves, the frequency characteristic is made irregular as shown in FIG. 3.

As is apparent from the above description, the irregularities in the frequency characteristic are attributed to the difference between the travel distance of the two sound waves. Accordingly, if the installation condition of the acoustic system or the listening position is changed, the peak and dip frequencies will also be changed. In order to compensate for this, it is possible to use a multi-band graphic equalizer 1-3, but it is considerably difficult to adjust such a device. In an acoustic system having a bass and treble controls only, it is impossible to compensate for the peaks and dips in the frequency characteristic.

FIG. 4 shows an example of a sound field. More specifically, FIG. 5 is a diagram showing the propagations of sounds in the sound field which is defined by two confronted walls. In FIG. 5, reference numeral 7-9 designates a listener. A direct sound wave 7-7L radiated from a left loudspeaker 7-5L and a sound wave 7-8R which is radiated from a right loudspeaker 7-5R and reflected by the left wall arrive the left ear of the listener 7-9. Similarly, a direct sound wave 7-7R radiated from the right loudspeaker 7-5R and a sound wave 7-8L which is radiated from the left loudspeaker 7-5L and reflected by the right wall reach the right ear of the listener 7-9.

For simplification in description, a direct wave and the first reflected wave are considered, and the correlation between the right and left ears with respect to a sound wave which is applied to the listener 7-9 in a direction will be disregarded. When signals $S_R$ and $S_L$ are applied to the right and left loudspeakers 7-5R and 7-5L, respectively, according to the above-described condition, signal sound waves represented by the following expressions (7-1) and (7-2) are applied to the right and left ears of the listener 7-9, respectively:

$$(S_L/L_1)e^{j\omega(-L1/c)}+(S_R/L_4)(K_1 e^{j\omega(-L4/c)} \tag{7-1}$$

$$(S_R/L_3)e^{j\omega(-L3/c)}+(S_L/L_2)K_2 e^{j\omega(-L2/c)} \tag{7-2}$$

where c is the sound velocity, $K_1$ and $K_2$ are the reflection factors of the right and left walls, respectively, and $L_1$ through $L_4$ are the travel distances of the sound waves 7-7L, 7-8L, 7-7R and 7-8R, respectively.

In expressions (7-1) and (7-2), the second terms represent the reflected sound components to the left and right ears, respectively. In general, for stereo signal reproduction, the channel signals include only musical information necessary for satisfactory reproduction. Therefore, if, when the channel signals are radiated in the form of sound waves from the loudspeakers in the room, in addition to the direct sound waves from the loudspeakers, namely, the original signals, there are a number of reflected sound components owing to the acoustic conditions of the room, the sound signals reaching to the ears of the listener could cause excess reverberation and poor channel separation, and make the frequency characteristic irregular. That is, in this case, excellent stereo signal reproduction cannot be expected.

SUMMARY OF THE INVENTION

Accordingly, an object of the invention is to eliminate the above-described difficulties accompanying a conventional acoustic system. Another object of the invention is to provide a sound field correcting system which can eliminate the effects of reflected sound waves and can compensate for sound waves of insufficient low frequency levels.

In accordance with the above and other objects, the invention provides a sound field correcting system in which, in order to eliminate the effects of reflected sound waves in the sound field, the original signal is added to a signal which is obtained by varying the characteristic of the original signal to form a loudspeaker driving signal, thereby to make the frequency characteristic of the composite sound signal received at the listening point essentially flat. More specifically, in a sound field correcting system of the invention, a signal obtained by adjusting the level and delay of the original signal is superposed on the original signal to obtain a signal for driving the loudspeaker, thereby to eliminate the effect of the reflected sound wave at the listening point in the sound field.

A feature of a sound field correcting system according to the invention resides in that a signal which is obtained by adjusting the level and delay of the original signal is added to the original signal to provide an output signal which is applied to the loudspeaker, and an HPF (High-Pass Filter) is inserted in the circuit for adjusting the level and delay of the original signal to compensate for sound waves of insufficient low frequency level.

In accordance with another embodiment of the invention, there is provided a sound field correcting system comprising: means for delaying a sound signal; level adjusting means for adjusting the level of the sound signal thus delayed; phase inverting means for inverting the phase of the signal thus level-adjusted; and mixing means for mixing the signal thus phase-inverted and the sound signal to correct nonuniformities in an acoustic frequency characteristic at a listening point caused by interference of a direct sound wave radiated directly from a loudspeaker and a reflected sound wave thereof, in which according to the invention, a low-pass filter is connected between the delay means and the level adjusting means, the frequency characteristic of the low-pass filter being determined according to the frequency characteristic of the reflected sound wave.

In a further embodiment of a sound field correcting system according to the invention, when a signal obtained by adjusting the level and delay of an original signal is added to the original signal, n signals having levels which are attended by factors of $\alpha^n$ (where $\alpha$ is a constant defined by $0<\alpha<1$, and n is a natural number), polarities defined by $(-1)^n$, and delay times of $n\tau$ (where $\tau$ is a constant) are produced and added to the original signal.

In accordance with a yet further embodiment of the invention, a system is provided wherein, when a signal obtained by adjusting a level and delay of an original signal is superposed on the original signal, a plurality of correcting signals different in level and phase are obtained from the original signal in order to cancel out a plurality of reflected sound waves which arrive at a predetermined listening point in a sound field through different paths.

A specific feature of a still further sound field correcting system according to the invention resides in that each of two drive systems adapted to drive front and rear loudspeakers of a vehicle has one pair of correcting means each of which delays, attenuates, and phase inverts an original signal to obtain a signal which is added to the original signal, thereby to make the sound pressure frequency characteristic flat. The field correcting system further includes delay means for delaying sound waves radiated from the rear loudspeakers by a predetermined period of time with respect to sound waves radiated from the front loudspeakers.

In yet further embodiments, the invention provides a sound field correcting system in which the interference of reflected sound waves in a stereo sound field which arise in response to right and left channel signals is eliminated to correct the irregularities in the frequency characteristic in the sound field, thereby to permit excellent stereo signal reproduction.

A specific feature of an example of such a sound field correcting system according to the invention resides in that the level and delay of a left channel signal are adjusted to obtain a first signal, and the first signal thus obtained is added to a right channel signal to provide an output which is applied to a right channel loudspeaker. The level and delay of the right channel signal are adjusted to obtain a second signal, and the second signal thus obtained is added to the left channel signal to provide output which is applied to a left channel loudspeaker, whereby the effects of the reflected sound waves at a predetermined listening point in the stereo sound field are cancelled out.

A specific feature of another example of such a sound field correcting system according to the invention resides in that the levels and delays of right and left channel signals are adjusted to obtain first and second signals, and the first and second signals thus obtained are added to the left channel signal to provide an output which is applied to a left channel signal. The levels and delays of right and left channel signals are adjusted to obtain third and fourth signals, and the third and fourth signals thus obtained are added to the right channel signal to provide an output which is applied to a right channel loudspeaker, whereby the effects of a plurality of reproduced sound waves in the stereo sound field are cancelled out.

In a yet further embodiment, the invention provides a sound field correcting system in which a correcting circuit whose characteristic is opposite the acoustic transfer characteristic between a loudspeaker and a listening point is inserted between the loudspeaker and the listening point to make the frequency characteristic in the sound field uniform.

In this case, provided according to the invention is a sound field correcting system for correcting the sound field which is formed by a direct sound wave radiated by a loudspeaker and a reflected sound wave thereof. A specific feature of this embodiment of the invention resides in that a feedback loop is provided in the amplification path between a signal source and the loudspeaker, and the transfer functions as to the level with the frequency and delay with frequency of the feedback loop are determined so as to eliminate the effects of the reflected sound wave.

According to another aspect of the invention, a sound field correcting system is provided which corrects the sound field which is formed by direct sound waves radiated from right and left channel loudspeakers and reflected sound waves thereof. A specific feature of this system resides in that the system comprises: subtraction means provided in input stages of respective amplification means provided respectively between a right channel signal source and a right channel loudspeaker and between a left channel signal source and a left channel loudspeaker, transmission means for applying a part of the signal which is applied to the right channel loudspeaker to the subtraction means in the left channel system, and transmission means for applying a part of the signal which is applied to the left channel loudspeaker to the subtraction means in the right channel system.

DESCRIPTION OF THE PREFERRED EMBODIMENTS

Preferred embodiments of the invention will be described with reference to the drawings.

Figure 6:
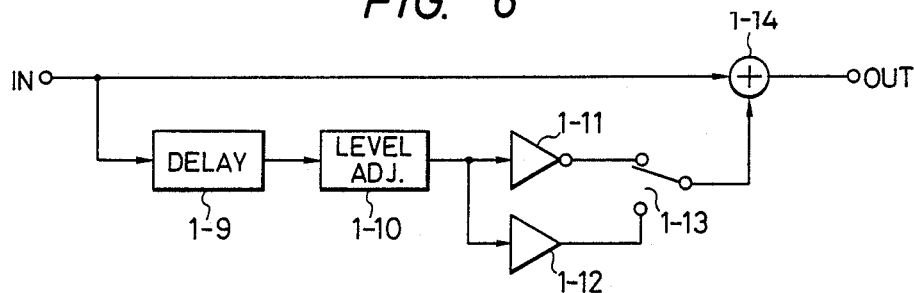
FIG. 6 is a block diagram showing a first embodiment of a sound field correcting system of the invention.

FIG. 6 is a block diagram showing a first embodiment of the invention. An original signal input is delayed by a delay unit 1-9 and applied to a level adjusting unit 1-10. The output of the level adjusting unit, i.e., the level-controlled signal, is applied to an inverter 1-11 and a buffer 1-12. One of the outputs of the inverter 1-11 and the buffer 1-12 is selected by a switch 1-13. The output thus selected and the original signal are applied to an adder 1-14, which provides a loudspeaker driving signal output.

Figure 1:
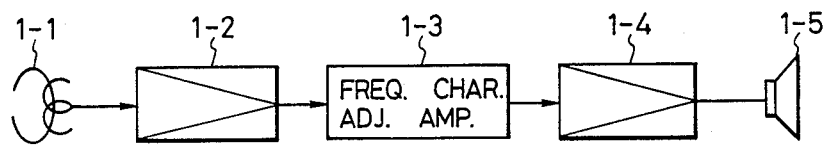
FIG. 1 is a block diagram indicating a conventional acoustic reproducing system.
Figure 2:
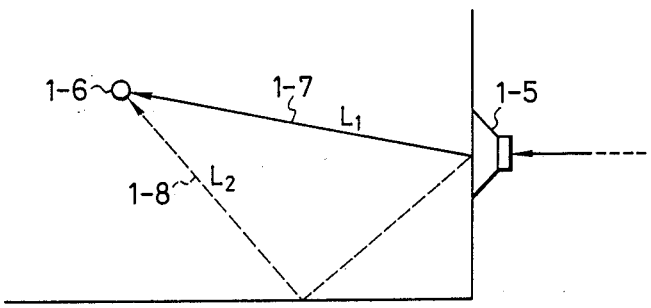
FIG. 2 is a diagram illustrating multiple paths between a speaker and a listening point in a conventional acoustic reproducing system.
Figure 3:
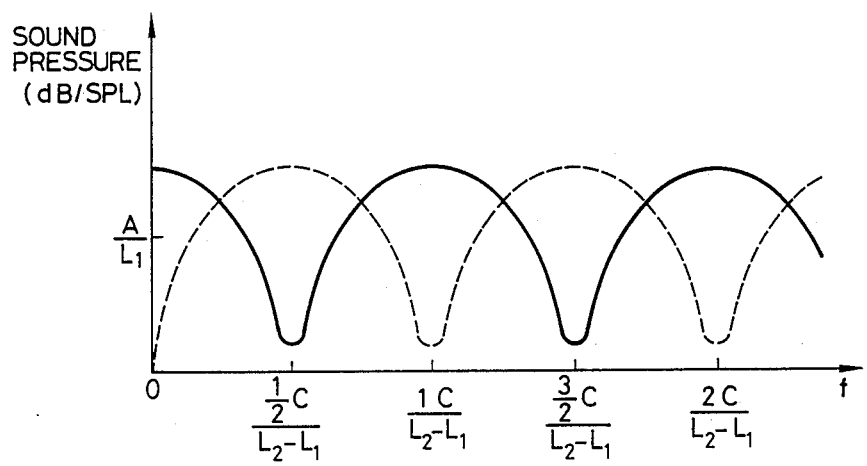
FIG. 3 is a graph showing peaks and dips at the listening point in the conventional system.

In the case where, in the sound field as shown in FIG. 2, the reflecting object produces a rigid-edge type reflection, control is effected so that the switch 1-13 selects the output of the inverter 1-11. If it is assumed that the original signal $S_1 = A\, e^{j\omega t}$, the delay time imparted by the delay unit 1-9 is $-(L_2-L_1)/c$, and the level set by the level adjusting unit is $KAL_1/L_2$, the selection output $S_D$ by the switch 1-13 is:

$$S_D = -(KAL_1/L_2)e^{j\omega(t-(L_2-L_1)/c)}. \qquad (1\text{-}5)$$

Therefore, the output $S_0$ of the adder 1-14 is—

$$\begin{aligned} S_0 &= S_1 + S_D \\ &= Ae^{j\omega t} - (KAL_1/L_2)e^{j\omega(t-(L_2-L_1)/c)}. \end{aligned} \qquad (1\text{-}6)$$

With this signal $S_0$ applied to the loudspeaker, the sound wave $S_M$ at the listening point 1-6 in FIG. 2 can be represented by the following expression (1-7) using expressions (1-1) and (1-6):

$$\begin{aligned} S_M &= (A/L_1)e^{j\omega(t-L_1/c)} - (KA/L_2)e^{j\omega(t-L_2/L_1)/c-L_1/c)} + \\ &\quad (KA/L_2)e^{j\omega(t-L_2/c)} - (K/L_2)(K^2AL_1/L_2^2)e^{j\omega(t-L_2/L_1)/c-L_2/c)} \\ &= (A/L_1)e^{j\omega(t-L_1/c)} - (K^2AL_1/L_2)e^{j\omega(t-(2L_2-L_1)/c)}, \end{aligned} \qquad (1\text{-}7)$$

where $0 \leq K < 1$ and $0 < L_1/L_2 < 1$.

In expression (1-7), the second term is much smaller than the first term, and therefore:

$$S_M \approx (A/L_1)e^{j\omega(t-L_1/c)}. \qquad (1\text{-}8)$$

Thus, effects of the reflected wave are essentially eliminated.

Figure 7:
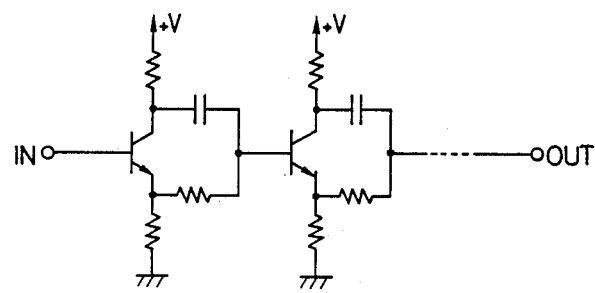
FIG. 7 is a circuit diagram of an example of a circuit element to be employed in the system of FIG. 6.

In the case of a free edge reflection, control is carried out so as to cause the switch 1-13 to select the output of the buffer 1-12. The delay unit 1-9 may be replaced by a phase shifter. The phase shifter, as shown in FIG. 7, is a conventional one implemented with transistors, resistors, and capacitors.

In the above described embodiment, the delay time imparted by the delay unit 1-9 is fixed in conformance with the distances $L_1$ and $L_2$ in FIG. 2. In practice, the sound field can have an essentially infinite variety of configurations. Accordingly, the circuit should be designed so that the delay time and the level adjustment can be varied. In the case of FIG. 2, a single point reflection occurs. However, in the case of multipath reflections, such as may commonly occur inside a vehicle, the vertical and horizontal lengths are substantially equal to one another, and the reflected sound waves are substantially equal in delay time to one another. Therefore, in this case, after compensation is made for one of the reflected sound waves, the delay time should be corrected.

Figure 8A:
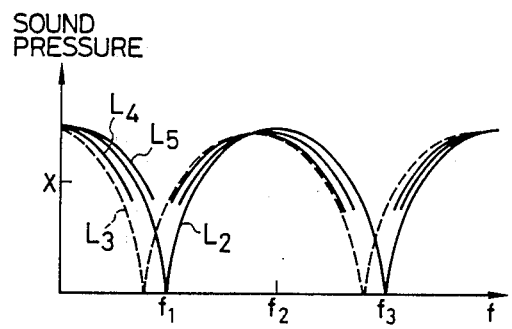
FIGS. 8A and 8B are diagrams showing a sound pressure vs. frequency characteristic at a listening point in a sound field such as a vehicle where multipoint reflections occur.
Figure 8B:
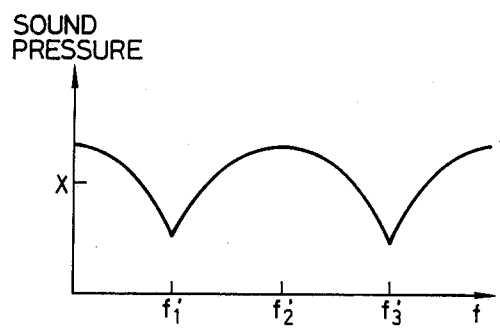

FIGS. 8A and 8B show sound pressure characteristics at a listening point in a vehicle sound field in such a case. FIG. 8A indicates sound pressure characteristics in the case where the lengths $L_n$ of the sound paths are substantially equal to one another ($L_2 \approx L_3 \approx L_4 \approx L_5$), and FIG. 8B indicates a synthetic sound pressure characteristic formed by all reflected sound waves at the listening point. In the latter case, compensation is made for the reflected sound waves as described above travelling along the path $L_2$, for instance, and then the delay time is corrected.

As is apparent from the above description, in the sound field correcting system according to this embodiment of the invention, a signal obtained by varying the frequency characteristic of the original signal so that the reflected sound waves are eliminated at the listening point is added to the original signal to obtain the loudspeaker driving signal. Therefore, the frequency characteristic at the listening point can be made essentially flat. Furthermore, the system is simple both in the adjustment required and in its construction, and it can be manufactured at a relatively low cost.

Figure 9:
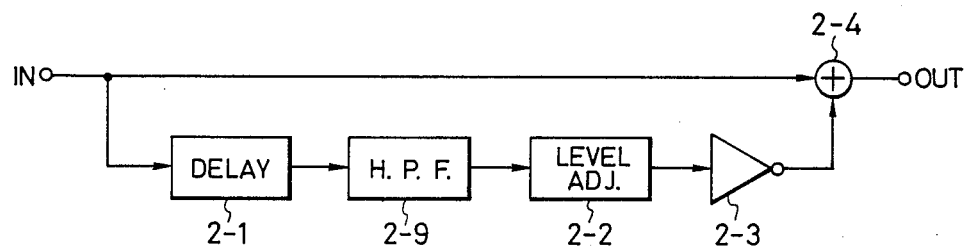
FIG. 9 is a block diagram showing another embodiment of a sound field correcting system of the invention.

FIG. 9 is a block diagram of another embodiment of the invention. In FIG. 9, the input signal IN is applied directly to one input terminal of an adder 2-4 and to another input terminal of the adder 2-4 via a series circuit of a delay unit 2-1, an HPF 2-9, a level adjusting circuit 2-2, and an inverter 2-3.

The original signal input IN ($S_1$) is delayed by $(L_2-L_1)/c$ by a delay unit 2-1 and is then applied to an HPF 2-9 where it is caused to have a frequency transfer characteristic G (for instance, the HPF having a level characteristic $$G = 1/\sqrt{1 + (f_0/f)^2}$$

where $f_0$ is the cutoff frequency). The output signal of the HPF 2-9 is applied to the level adjusting unit 2-2, where the level of the signal is adjusted to $KAL_1/L_2$. The output signal of the unit 2-2 is subjected to phase inversion by the inverter 2-3. Therefore, the output signal of the inverter 2-3 is as represented by the following expression (2-1):

$$S_D = -G(KAL_1/L_2)e^{j\omega(t-(L_2-L_1)/c)}. \quad (2\text{-}1)$$

Therefore, the loudspeaker drive signal $S_O$ is:

$$\begin{aligned} S_O &= S_1 + S_D \\ &= Ae^{j\omega t} - G(KAL_1/L_2)e^{j\omega(t-(L_2-L_1)/c)}. \end{aligned} \quad (2\text{-}2)$$

On the other hand, when the loudspeaker outputs the signal $S_0$ represented by the expression (2-2), the sound wave $S_M$ at the listening point is:

$$\begin{aligned} S_M &= S_S + S_R \\ &= (A/L_1)e^{j\omega(t-L_1/c)} - G(KA/L_2)e^{j\omega(t-(L_2-L_1)/c-L_1/c)} + \\ &\quad (KA/L_2)e^{j\omega(t-L_2/c)} - \\ &\quad (K/L_2)(GKAL_1/L_2)e^{j\omega(t-(L_2-L_1)/c-L_1/c)} \\ &= (A/L_1)e^{j\omega(t-L_1/c)} + (1-G)(KA/L_2)e^{j\omega(t-L_2/c)} - \\ &\quad (GK^2AL_1/L_2^2)e^{j\omega(t-(2L_2-L_1)/c)} \end{aligned} \quad (2\text{-}3)$$

In expression (2-3), $0 \leq K < 1$. Therefore, in expression (2-3), the third term is much smaller than the first term. Therefore, the sound wave $S_M$ at the listening point is:

$$S_M = (A/L_1)e^{j\omega(t-L_1/c)} + \quad (2\text{-}4)$$
$$[1 - 1/\sqrt{1 + (f_0/f)^2}](KA/L_2)e^{j\omega(t-L_2/c)}.$$

Figure 10:
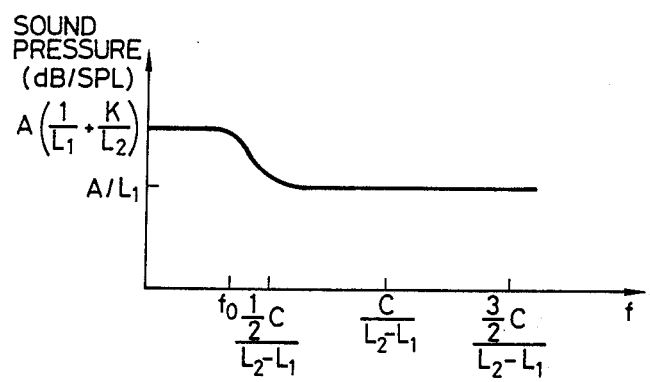
FIG. 10 is a graph showing a sound pressure level produced using the system of FIG. 9.

FIG. 10 shows a graphical representation of the expression 2-4. As is apparent from FIG. 10, boosting the low frequency level is achieved with the HPF 2-9.

As is apparent from the above description, in accordance with the second embodiment of the invention, the reflected sound wave is cancelled by controlling the delay and the level of the original signal, and furthermore the HPF having the cutoff frequency $f_0$ is inserted in the original signals's delay and level controlling system to boost the low frequency level.

Figure 11:
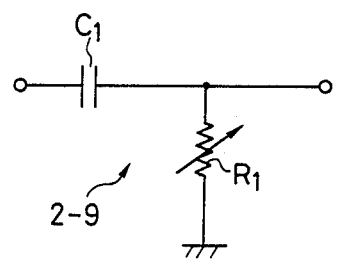
FIG. 11 shows a level adjusting circuit which may be used in the system of FIG. 9.

In this embodiment, the cutoff frequency $f_0$ of the HPF 2-9 is determined according to the sound field characteristic established by the direct sound $L_1$ and the reflected sound path $L_2$. However, in practice, the HPF 2-9 should be implemented with a variable resistor $R_1$, as shown in FIG. 11, so that the cutoff frequency $f_0$ can be selected as required. In FIG. 11, $C_1$ designates a capacitor.

According to the second embodiment of the invention, the HPF is used to change the frequency characteristic of the signal which is added to the original signal, and therefore sound waves at the listening point are remarkably improved in low frequency level. That is, sound waves of insufficient low frequency level are compensated for, with the result that the low frequency reproduction capability is substantially increased.

Figure 12:
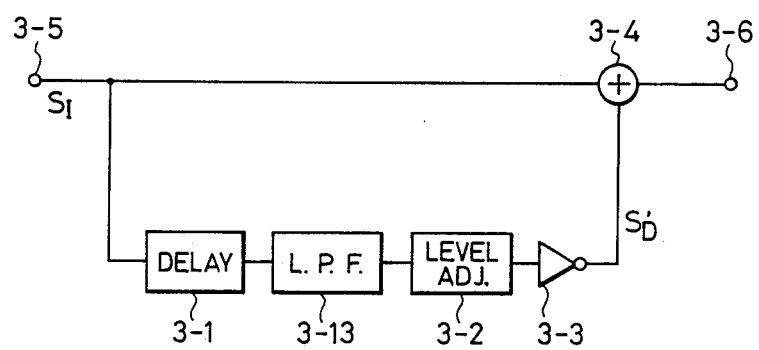
FIG. 12 is a block diagram of a third embodiment of a sound field correcting system of the invention.

FIG. 12 shows an example of a sound field correcting system according to a third embodiment of the invention. The sound field compensating system of this embodiment differs from that of FIG. 9 in that a LPF (low-pass filter) is connected between a delay element 3-1 and a level adjusting unit 3-3.

The operation of the sound field correcting system of FIG. 12 will now be described.

Within the frequency range higher than the cutoff frequency $f_0$ of 2 KHz for instance, the sound reflection factor has a tendency of decreasing. It is assumed that the reflected sound wave $S_R$ reflected from the wall has an amplitude characteristic:

$$G = 1/\sqrt{1 + (f/f_0)^2}$$

where f is frequency and $f_0$ is the cutoff frequency.

When a sound signal $S_I = Ae^{j\omega t}$ is applied to the signal input terminal 3-5, it is delayed by $(L_2 - L_1)/c$ by the delay element 3-1. The signal thus delayed is applied to the LPF 3-13 where it is processed to have a frequency characteristic which can provide the transfer characteristic G of the reflected sound wave. The output signal of the LPF 3-13 is applied to the level adjusting unit 3-2 where the signal strength A is adjusted to $KAL_1/L_2$. The output signal of the level adjusting unit 3-2 is subjected to phase inversion by the phase inverter 3-3. The output signal $S_D'$ of the phase inverter 3-3 can be represented by the following expression (3-1):

$$S_{D'} = -G \frac{KAL_1}{L_2} e^{j\omega(t - \frac{L_2-L_1}{c})} \quad (3\text{-}1)$$

The signal $S_D'$ is supplied to the mixing circuit 3-4, where it is mixed with the signal $S_I$, as a result of which a signal $S_0'$ is provided at the signal output terminal 3-6.

$$\begin{aligned}
S_{0'} &= S_I + S_{D'} \quad (3\text{-}2)\\
&= Ae^{j\omega t} - G\frac{KAL_1}{L_2} e^{j\omega(t - \frac{L_2-L_1}{c})}.
\end{aligned}$$

The signal $S_0'$ is outputted as the output signal of the loudspeaker.

The synthetic sound wave $S_M'$ of the direct sound wave $S_S$ is radiated from the loudspeaker 3-7 and advances along the direct path of length $L_1$ and the reflected sound wave $S_R$ and is heard at the listening point. Since the direct sound wave $S_S'$ advances along the direct path, its signal strength is decreased by a factor of $1/L_1$ and delayed by $L_1/c$. On the other hand, since the reflected sound wave is reflected by the wall, i.e., it advances along the indirect path, its signal strength is decreased by a factor of $1/L_2$ and delayed by $L_2/c$. Accordingly, the sound wave $S_M'$ at the listening point can be represented by the following expression (3-3):

$$\begin{aligned}
S_{M'} &= S_{S'} + GS_{R'} \quad (3\text{-}3)\\
&= \frac{A}{L_1} e^{j\omega(t - L_1/c)} -\\
&\quad G\frac{KAL_1}{L_1 L_2} e^{j\omega(t - (L_2-L_1)/c - L_1/c)} +\\
&\quad G\frac{KA}{L_2} e^{j\omega(t - L_1/c)} -\\
&\quad G\frac{K}{L_2} \cdot \frac{KAL_1}{L_2} e^{j\omega(t - (L_2-L_1)/c - L_2/c)}\\
&= \frac{A}{L_1} e^{j\omega(t - L_1/c)} -\\
&\quad \frac{GK^2 AL_1}{L_2^2} e^{j\omega(t - (2L_2-L_1)/c)}
\end{aligned}$$

In the expression (3-3), $K < 1$, and therefore the signal strength of the second term is much smaller than that of the first term. Therefore, the sound wave $S_M'$ at the listening point is:

$$S_{M'} \simeq \frac{A}{L_1} e^{j\omega(t - L_1/c)}. \quad (3\text{-}4)$$

As is apparent from expression (3-4), the reflected sound wave $S_R'$ is cancelled out. Therefore, the difficulty of the direct sound wave $S_S'$ and the reflected sound wave $S_R$ interfering with each other at the listening point is not caused. Accordingly, the sound wave $S_M'$ can be heard with the same frequency characteristic as that of the original signal $S_I$ inputted to the signal input terminal of the sound field correcting system. In other words, at the listening point, the reflected sound wave $S_R'$ is cancelled out, as a result of which nonuniformities in the acoustic frequency characteristics at the listening point, which otherwise may be caused by interference of the direct sound wave $S_S'$ and the reflected sound wave $S_R'$, are corrected.

Figure 13:
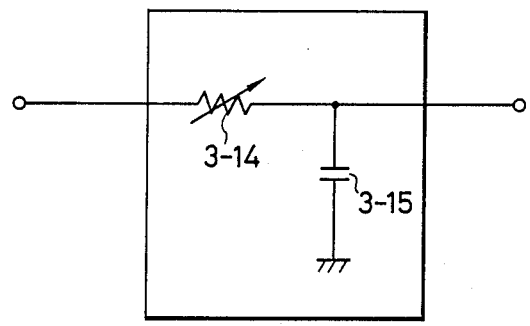
FIG. 13 is a circuit diagram of an example of a level adjusting circuit to be used in the system of FIG. 12.

In the above-described embodiment, the frequency characteristic of the LPF 3-13 is entirely determined according to the frequency characteristic of the reflected sound wave. However, since the frequency characteristic of the reflected sound wave depends on the material of the wall, etc., it is necessary to take into account a considerably large number of frequency characteristics for reflected sound waves, especially frequencies affected by the conditions of reflecting objects. Accordingly, it is preferable to use an LPF (3-13) whose frequency characteristic can be changed as required. FIG. 13 is a circuit diagram showing an example of such a variable low-pass filter, made up of a variable resistor 3-14 and a capacitor 3-15.

According to the third embodiment, the low-pass filter is added to the sound field correcting system, and the frequency characteristic of the low-pass filter is adjusted so as to provide the transfer characteristic of the reflected sound wave to the signal passed through the low-pass filter. As a result, at the listening point, the reflected sound wave is cancelled out, and therefore the difficulty that the direct sound wave and the reflected sound wave interfere with each other is eliminated.

Figure 14:
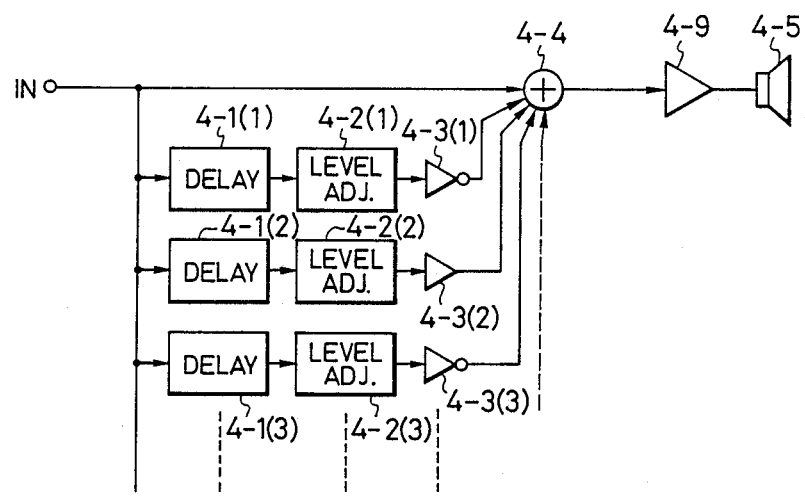
FIGS. 14 through 23 and 25 through 29 show further embodiments of sound field correcting systems of the invention.

FIG. 14 is a block diagram showing a fourth embodiment of the invention. In FIG. 14 an original signal IN is applied to n delay units 4-1(1) through 4-1(n), where it is delayed by a predetermined delay time $n\tau$. The outputs of the delay units 4-1(1) through 4-1(n) are applied to n level adjusting units 4-2(1) through 4-2(n) respectively, where they are attenuated $\alpha^n$. The outputs of the level adjusting units 4-2(1) through 4-2(n) are applied to inverters and buffers 4-3(1) through 4-3(n), respectively. In the case where n is an odd number, the circuit elements (4-3(1) ... 4-3(n)) are inverters, and the output is subjected to polarity inversion. In the case where n is an even number, the circuit elements are buffers, and the output is not subjected to polarity inversion. The n outputs of these inverters or buffers are added to the original signal IN by an adder 4-4, the output of which is applied, as a drive signal, to a loudspeaker 4-5 through a power amplifier 4-9.

The operation of the sound field correcting system according to the fourth embodiment will be described. As mentioned above, when, in order to eliminate the reflected wave, a signal equal in level thereto and different by 180° in phase therefrom at the listening point is applied to the loudspeaker, the signal is reflected from a wall, etc., to produce a reflected wave. Therefore, a signal which is equal in level to and different by 180° in phase from the reflected wave is applied to the loudspeaker. If this operation is repeatedly carried out, the reflected wave level will gradually be decreased to a value which can be disregarded.

This will be described in more detail. First, the signal $S_D$ mentioned above is subjected to addition and applied to the loudspeaker. The signal $S_D$ is reflected by a wall, etc. to reach the listening point, and the reflected wave is represented by the sound term in expression (1-7). The reflected wave can be cancelled out by applying a signal represented by the following expression (4-1) to the loudspeaker:

$$(L_1/L_2)^2 A K^2 e^{j\omega(2(L_2-L_1)/c)}. \qquad (4\text{-}1)$$

The signal represented by expression (4-1) is reflected by a wall, etc., as a result of which a signal represented by the following expression (4-2) is produced at the listening point:

$$(L_1/L_2)^2 \cdot A K^2 \cdot (K/L_2) e^{j\omega(t-2(L_2-L_1)/c-L_2/c)}. \qquad (4\text{-}2)$$

The reflected wave represented by the expression 4-2 can be cancelled out by applying a signal represented by the following expression (4-3) to the loudspeaker:

$$(L_1/L_2)^3 \cdot A K^3 e^{j\omega(3(L_2-L_1)/c)} \qquad (4\text{-}3)$$

Similarly, the n-th reflected wave can be cancelled out by applying a signal represented by the following expression (4-4) to the loudspeaker:

$$(-1)^n \cdot (L_1/L_2)^n \cdot A \cdot (K)^n \cdot e^{j\omega(n(L_2-L_1)/c)}. \qquad (4\text{-}4)$$

This is realized by the circuit shown in FIG. 14. In the expression (4-4), the term $(-1)^n$ indicates that, when n is an odd number, the circuit element 4-3(n) is an inverter, and phase inversion is carried out, and when n is an even number, the circuit element 4-3(n) is a buffer and phase inversion is not carried out. Furthermore, in expression (4-4), the term $(KL_1/L_2)^n$ indicates that the signal is passed through the delay units 4-1(1) through 4-1(n) having an amount of attenuation $\alpha^n$ (where $\alpha = KL_1/L_2$), while the term $e^{j\omega(n(L_2-L_1)/c)}$ indicates that the signal is passed through the delay units 4-1(1) through 4-1(n) having a delay time $n \cdot \tau$ (where $\tau = (L_2-L_1)/c$).

Thus, with the circuit shown in FIG. 14, the reflected waves are all cancelled out to the extent that they can be disregarded.

Figure 15:
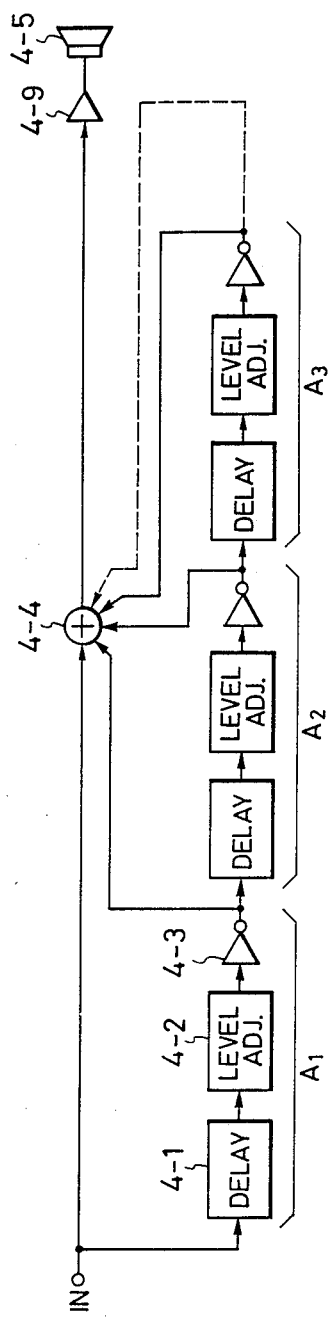

FIG. 15 is a block diagram showing a fifth embodiment of this invention. As shown in FIG. 15, n circuit blocks $A_1$ through $A_n$ each include a delay unit 4-1, a level adjusting unit 4-2, and an inverter 4-3, which elements are cascade connected, and the outputs of the circuit blocks $A_1$ through $A_n$ are applied to an adder 4-4 so that they are added to an original signal IN. Each of the delay units 1 has a delay time $\tau = (L_2-L_1)/c$, and each of the level adjusting units 4-2 causes and amount of attenuation $\alpha = KL_1/L_2$.

The fifth embodiment operates in the same manner as the fourth embodiment shown in FIG. 14 to substantially completely eliminate the reflected waves.

Figure 16:
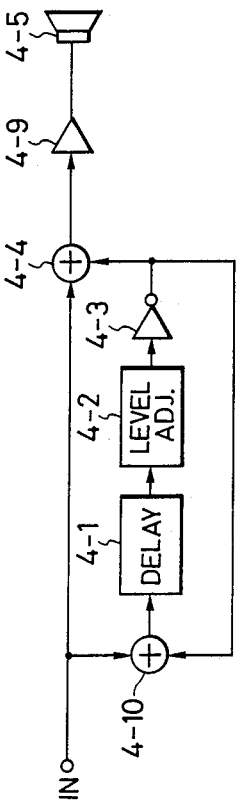

FIG. 16 is a block diagram showing a sixth embodiment of the invention. In the sixth embodiment, a signal passed through a delay unit 4-1, a level adjusting unit 4-2 and an inverter 4-3 is fed back to the input terminal of the delay unit 4-1 through an adder 4-10. The signal is repeatedly passed through the delay unit 4-1 having the same delay time $\tau$ and the level adjusting unit 4-2 having the same amount of attenuation $\alpha$. The sixth embodiment has the same effects as the fourth and fifth embodiments shown in FIGS. 14 and 15.

Figure 17:
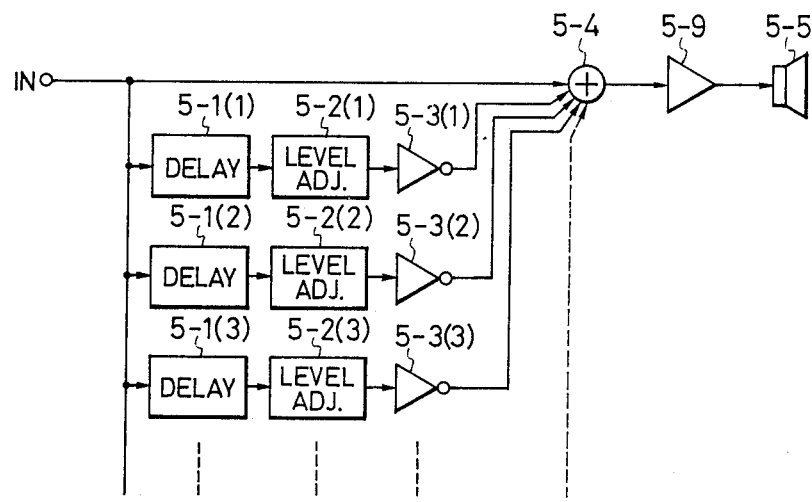

FIG. 17 is a block diagram showing a seventh embodiment of the invention. In FIG. 17, an original signal IN is applied to n delay units 5-1(1) through 5-1(n) (n being an integer larger than one), the outputs of which are applied to n level adjusting units 5-2(1) through 5-2(n). The outputs of the level adjusting units 5-2(1) through 5-2(n) are applied through respective inverters 5-3(1) through 5-3(n) to an adder 5-4 where they are added to the original signal IN. The output of the adder 5-4 is applied through a power amplifier 5-9 to a loudspeaker 5-5 to drive the latter.

Figure 4:
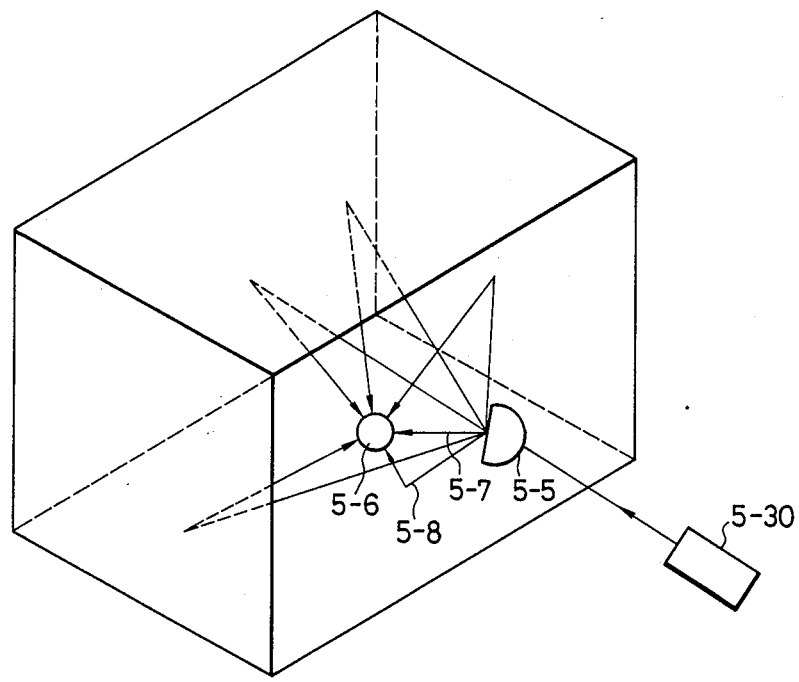
FIG. 4 is a diagram showing multiple paths and reflections between a speaker and a listener in a conventional acoustic reproducing system.

The delay time $\tau$ of the delay unit 5-1(1) and the amount of level attenuation $\alpha$ of the level adjusting unit 5-2(1) are functions of the path length $L_2$ of the reflected sound wave 5-8 (see FIG. 4) and the path length $L_1$ of the direct sound wave 5-7: $\tau \propto (L_2-L_1)/c$ and $\alpha \propto L_1/L_2$, thereby to eliminate the effects of reflected sound waves.

The delay time $\tau$ of the delay unit 5-1(2) and the amount of level attenuation $\alpha$ of the level adjusting unit 5-2(2) are functions of the path length $L_3$ of another reflected sound wave and the path length $L_1$ of the direct sound wave: $\tau \propto (L_3-L_1)/c$ and $\alpha \propto L_1/L_3$. Similarly, the delay times of the delay units 5-1(3) through 5-1(n) and the amounts of level attenuation of the level adjusting units 5-3(3) through 5-3(n) are functions of the path lengths of other reflected sound waves and the path length of the direct sound wave, eliminating the effects of the reflected wave.

Figure 18:
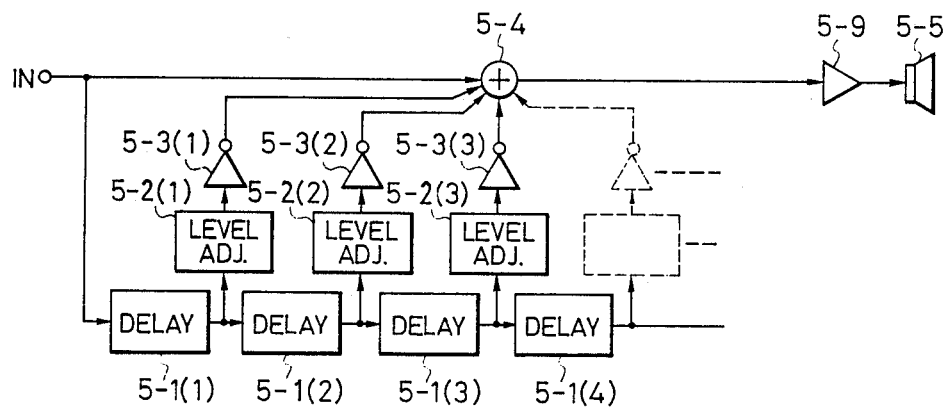

FIG. 18 is a block diagram showing an eighth embodiment of the invention. As shown in FIG. 18, n delay units 5-1(1) through 5-1(n) are cascade-connected. The delay outputs provided at the cascade-connecting points are applied to n level adjusting unit 5-2(1) through 5-2(n), respectively. The outputs of the level adjusting units 5-2(1) through 5-2(n) are supplied respectively through n inverters 5-3(1) through 5-3(n) to an adder 5-4. The remaining circuit arrangement is the same as that of the embodiment of FIG. 17.

The delay units 5-1(1) through 5-1(n) are connected in series. Therefore, the delay time of the delay output of any one of the delay units is the sum of the delay times of the preceding delay units. In other words, the reflected wave having the shortest reflection distance is cancelled out by the output signal of the delay unit 5-1(1), the reflected sound wave having the next shorter reflection distance is cancelled out by the output signal of the delay unit 5-1(2), and so forth. The operation of the level adjusting units 5-2(1) through 5-2(n) and the inverters 5-3(1) through 5-3(n) are the same as those in FIG. 17.

Figure 19:
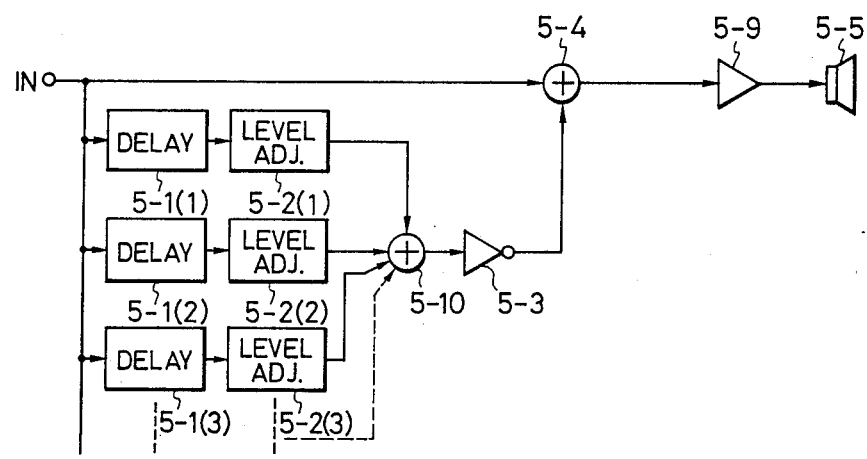

FIG. 19 is a block diagram showing a ninth embodiment of the invention. The sound field correcting system shown in FIG. 19 is obtained by employing a single inverter 5-3 instead of the plural inverters 5-3(1) through 5-3(n) in the embodiment shown in FIG. 17. The outputs of the level adjusting units 5-2(1) through 5-2(n) are applied to an adder 5-10, the output of which is supplied through the single inverter 5-3 to the adder 5-4.

Figure 20:
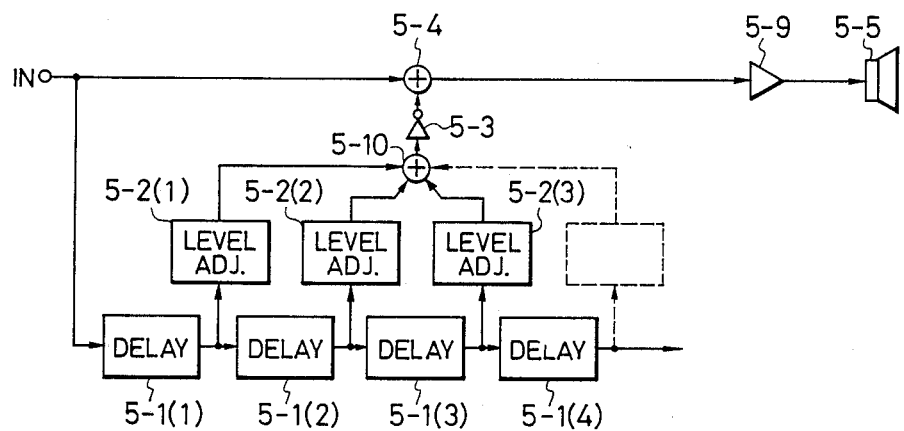

FIG. 20 is a block diagram showing a tenth embodiment of the invention. The tenth embodiment is obtained by using a single inverter 5-3 instead of the inverters 5-3(1) through 5-3(n) in FIG. 18. The outputs of the level adjusting units 5-2(1) through 5-2(n) are applied to an adder 5-10, the output of which is supplied through the inverter 5-3 to the adder 5-4.

In accordance with another aspect of the invention, an acoustic system for a vehicle according to the invention has four loudspeakers: one pair of loudspeaker installed on the right and left sides of the front seat, and another pair of loudspeakers installed on the right and left sides of the rear seat. The pair of loudspeakers for the front seat can be installed on the right and left front doors or on the instrument panel. The pair of loudspeakers for the rear seat are installed on the right and left rear doors or on the parcel tray.

Figure 21:
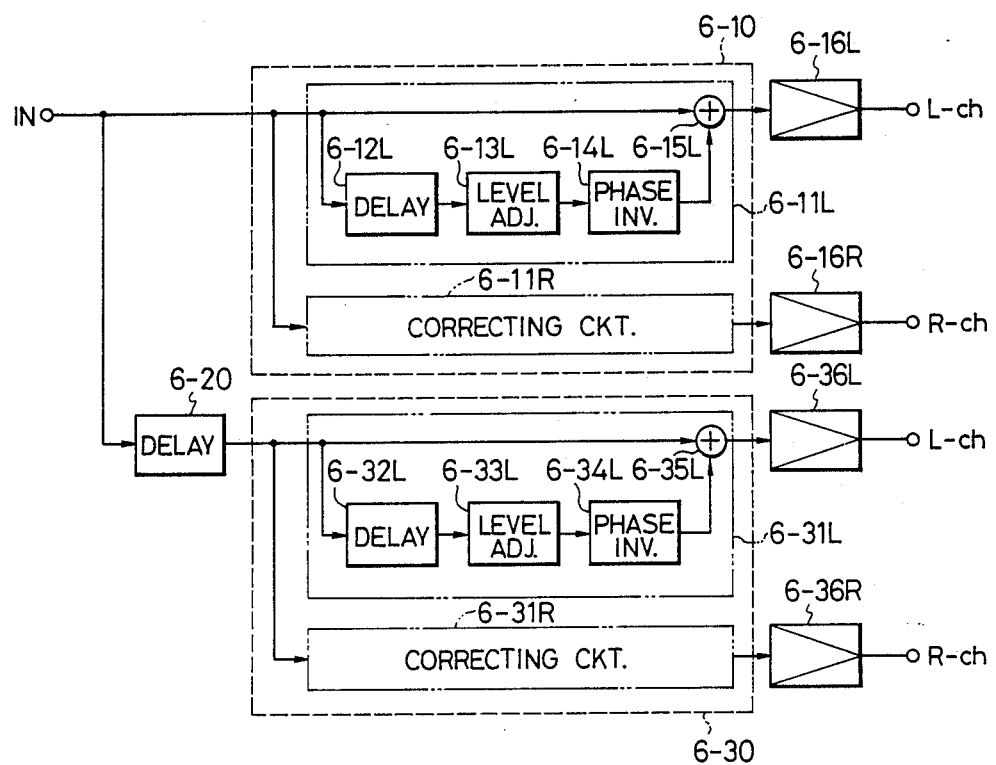

As shown in FIG. 21, an audio signal from a signal source is applied to a correcting circuit 6-10 for the front seat, and it is further applied through a delay circuit 6-20 to a correcting circuit for the rear seat. With this arrangement, irregularities in the low frequency characteristics which might otherwise be caused by the interference of direct sound waves from the loudspeakers with reflected sound waves is corrected. The correcting circuit 6-10 for the front seat, similar to the correcting circuit 6-30, has two symmetrical signal systems for one pair of loudspeakers installed on the right and left sides, and hence only one of the signal systems will be described.

In the left correcting circuit 6-11L for the front seat, an input signal, namely, an original signal, is delayed by a delay circuit 6-12L, implemented with a BBD or CCD, so that it has peak and dip frequencies. The signal is then subjected to level adjustment by a level adjusting circuit 6-14 so that the peak and dip levels are corrected. The signal thus level adjusted is subjected to phase inversion by a phase inverter 6-14L, the output of which is added to the original signal by an adder 6-15L. The output of the adder 6-15L is applied through a power amplifier 6-16 to the left channel loudspeaker to drive the latter.

In the presently described embodiment, the delay time of the delay circuit 6-12L is fixed in conformance with the distances $L_1$ and $L_2$. However, in practice, there are an infinite number reflections in the sound field, and infinite numbers of distances $L_1$ and $L_2$ exist. Therefore, the sound field correcting system should be designed so that the delay time and the level adjustment can be varied as required.

The correcting circuit 6-30 for the rear seat is completely the same as the correcting circuit 6-10 for the front seat. The delay circuit 6-20 is used to delay the sound radiated from the rear side loudspeaker with respect to the sound from the front side loudspeaker. The delay circuit 6-20 is made up of BBDs or CCDs. A precedence sound effect due to the time difference given by the delay circuit 6-20 localizes the sound image forward in the sound field inside the vehicle.

Figure 22:
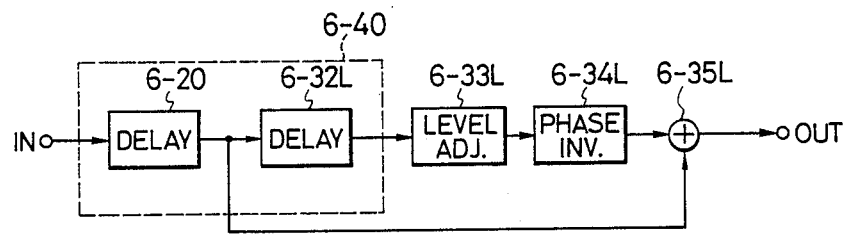

FIG. 22 is a circuit diagram showing another embodiment of the invention. In this embodiment, the delay circuit 6-20 and the delay circuit 6-32L for the rear seat are combined into one unit which is made up of delay elements such as BBDs or CCDs with taps. In many cases, as the space in a vehicle is increased, it is necessary to increase the delay time required for making the sound pressure frequency characteristic smooth, and the difference between the distance between the front sound source and the listening point and the distance between the rear sound source and the listening point is increased. Therefore, if the number of BBDs or CCDs in the delay circuit 6-40, which is obtained by combining the delay circuits 6-20 and and 6-32L, is suitably selected, then the delay circuit 6-40 can be formed by only one delay element with taps. This contributes to a reduction in manufacturing cost and to an elimination of the difficulty of beats between clock pulses affecting the external circuits.

As is apparent from the above description, according to this embodiment of the invention, each of the drive systems for the front and rear loudspeakers is provided with one pair of correcting means, in each of which the original signal is delayed, attenuated and inverted in phase. The signal thus obtained is added to the original signal to make the sound pressure frequency characteristic flat. Delaying means is provided which delays sound waves radiated from the rear loudspeakers by a predetermined period of time with respect to sound waves radiated from the front loudspeakers. Therefore, with the sound field correcting system for vehicles according to the invention, the sound pressure frequency characteristics both at the front seat are made excellent. In addition, the sound image can be localized forwardly in the sound field inside the vehicle by the precedence sound effect due to the time difference between the front and rear sound sources.

In order to cancel out the reflected sound waves, which adversely affect the stereo signal reproduction, in accordance with other embodiments of the invention, the fact is utilized that the reflected sound waves of the channels cross each other to reach the right and left ears of the listener. That is, components which can cancel out the reflected sounds are added, as electrical signals, to the original signals of the channels on the opposite sides.

The right channel signal $S_R$ is reflected, as a sound wave, by the left wall and is then applied to the left ear. In order to cancel out the reflected sound signal, a signal represented by the following expression should be added, as an input signal to the left loudspeaker 7-5L, to the original signal $S_L$ in advance, as is apparent from the second term in the expression (7-1):

$$-S_R(L_1/L_4)K_1 e^{j\omega(-(L_4-L_1)/c)}.$$

Therefore, a signal $S_{LO}$ to be inputted to the left loudspeaker 7-5L is:

$$S_{LO}=S_L-S_R(L_1/L_4)K_1 e^{j\omega(-(L_4-L_1)/c)}. \tag{7-3}$$

Similarly, a signal $S_{RO}$ to be applied to the right loudspeaker 7-5R is:

$$S_{RO}=S_R-S_L(L_3/L_2)K_2 e^{j\omega(-(L_2-L_3)/c)}. \tag{7-4}$$

Figure 23:
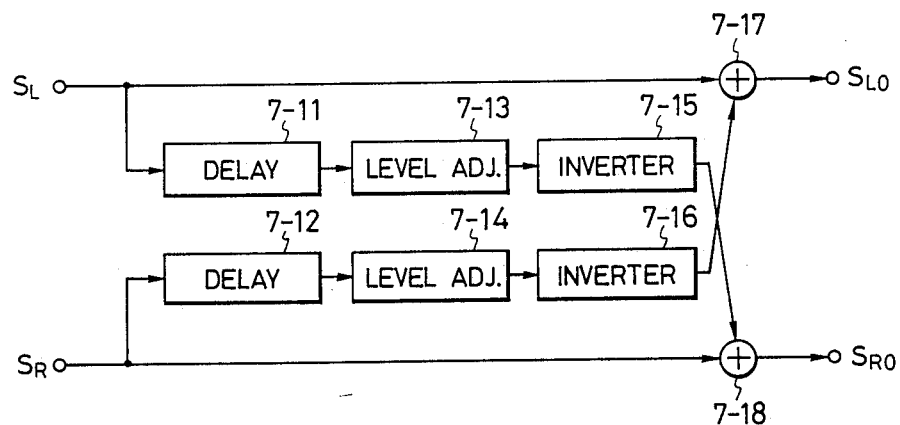

An example of a device for obtaining the signals $S_{LO}$ and $S_{RO}$ is shown in FIG. 23. The left and right channel signals $S_L$ and $S_R$ are applied through delay units 7-11 and 7-12, level adjusting units 7-13 and 7-14, and inverters 7-15 and 7-16 to adders 7-18 and 7-17, respectively, where the signals thus treated are added to the right and left channel signals $S_R$ and $S_L$, respectively. The outputs of the adders 7-17 and 7-18 are the signals $S_{LO}$ and $S_{RO}$ applied to the left and right channel loudspeakers, respectively.

A signal level and phase adjustment system (7-11, 7-13 and 7-15) provides the second term of the expression (7-4). The delay unit 7-11 imparts a delay of $(L_2-L_3)/c$. The level adjusting unit 7-13 effects level control by a factor of $(L_3/L_2)K_2$. The inverter 7-15 performs polarity inversion.

Similarly, the delay unit 7-12, the level adjusting unit 7-14 and the inverter 7-16 provides the second term of the expression (7-3).

In the case of an actual wall, the reflection factor varies with frequency. Therefore, the level adjusting units 7-13 and 7-14 may provide level adjustment as a function of $\omega$. In the above-described embodiment, the signals are inverted in polarity by the inverters 7-15 and 7-16. However, the inverters 7-15 and 7-16 may be replaced by phase shifters because changing the signal phases in the range of 0° to 90°, depending on the correlation between the original signals $S_L$ and $S_R$, makes it possible to control the sharpness of peaks and dips in the composite frequency characteristic during mixing, which facilitates adjustment.

Figure 24:
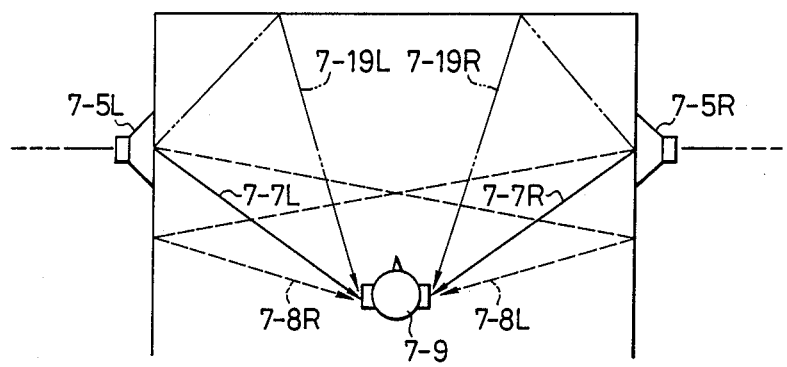
FIG. 24 is a diagram showing a sound wave pattern where sound waves bounce off side and front walls and is used in explaining the operation of a sound field correcting system of the invention.
Figure 25:
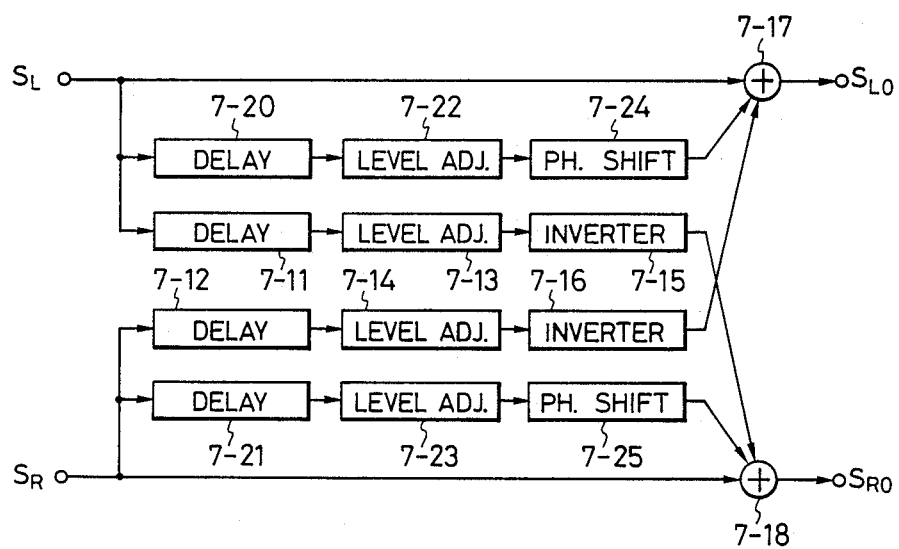

In a sound field where, as shown in FIG. 24, two walls are provided on opposite sides of a listener's head 7-9 and another wall is disposed in front of the listener's head 7-9, reflected waves 7-19L and 7-19R reflected by the front wall reach the listener's right and left ears. In another embodiment of the invention shown in FIG. 25, the effects of reflected waves 7-19L and 7-19R are eliminated. In FIG. 25, those components which have been previously described with reference to FIG. 23 are therefore designated by the same reference numerals.

The embodiment shown in FIG. 25 differs from that shown in FIG. 23 in that the levels and phases of the right and left channel signals $S_R$ and $S_L$ are controlled. A circuit system consisting of a delay unit 7-20, a level adjusting unit 7-22 and a phase shifter (or inverter) 7-24, and a circuit system consisting of a delay unit 7-21, level adjusting unit 7-23 and a phase shifter (or inverter) 7-25 are added to the circuit shown in FIG. 23. The output of the left channel circuit system is applied to the left channel adder 7-17, and the output of the right channel circuit system is applied to the right channel adder 7-18.

The delay time of the delay unit 7-20 is a function of the difference in travel distance between the direct wave 7-7L and the reflected wave 7-19L, and the delay time of the delay unit 7-21 is a function of the difference in travel distance between the direct wave 7-7R and the reflected wave 7-19R. The attenuation of each of the level adjusting units 7-22 and 7-23 is a function of the ratio of the travel distance of the direct wave to the travel distance of the reflected wave and the wall's reflection factor.

As is apparent from the above description, according to the invention, a simple circuit corrects the propagation characteristic in the sound field in a general room (including the sound field in a vehicle) and the adjustment thereof can be achieved readily. In addition, the sound field correcting system of the invention can be manufactured at relatively low cost and can be suitably applied to a stereo reproducing device mounted on a vehicle.

Figure 26:
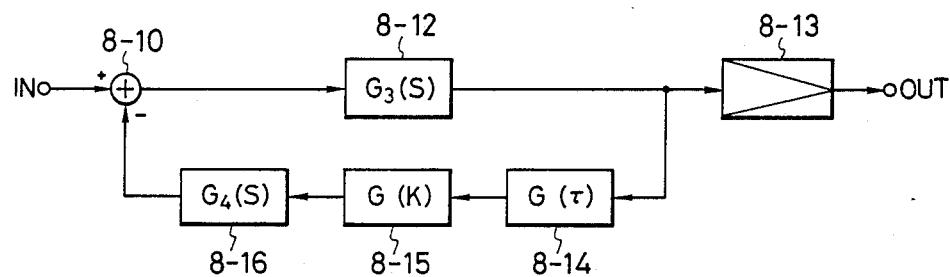

FIG. 26 is a block diagram showing another embodiment of the invention. As shown in FIG. 26, an input signal IN from a signal source (not shown) is applied through a subtractor 8-10 to an amplifier 8-12 having a transfer function $G_3(\omega)$. The output of the amplifier 8-12 is applied to a power amplifier 8-13 and also to a feedback loop.

The feedback loop includes a device 8-14 having a phase shifting function or a time delaying function, and is a delay unit made up of CCDs (charge coupled devices). The transfer characteristic of the device 8-14 is represented by $G(\tau)$. The output of the delay unit 8-14 is applied to a level adjusting unit 8-15, which has a level adjusting function depending on the level of a reflected wave and has a transfer characteristic represented by $G(k)$. The output of the level adjusting unit 8-15 is applied to the subtractor 8-10 through an amplifier 8-16 having a transfer characteristic $G_4(\omega)$.

If it is assumed for simplification of description that the gain of the power amplifier 8-13 is unity, then the characteristic $G_C(\omega)$ of the amplifying system shown in FIG. 26 can be represented by the following expression 8-1:

$$G_C(\omega) = G_3(\omega)/(1 + G_3(\omega) \cdot G_4(\omega) \cdot G(k) \cdot G(\tau)). \quad (8\text{-}2)$$

On the other hand, the transfer characteristic between the loudspeaker and the listening point is represented by $G_A(\omega)$, as described before, and therefore the over-all characteristic $G(\omega)$ is:

$$\begin{aligned}
G(\omega) &= G_C G_A \\
&= G_3(\omega)/(1 + G_3(\omega) \cdot G_4(\omega)G(k) \cdot G(\tau)) \times \\
&\quad G_1(\omega)(1 + G(\tau) \cdot G(k) \cdot G_2(\omega)/G_1(\omega)) \\
&= (1 + (G_2(\omega)/G_1(1\partial))G(\tau) \cdot G(k))/(1 + \\
&\quad G_3(\omega) \cdot G_4(\omega) \cdot G(\tau)) \times G_1(\omega) \cdot G_3(\omega).
\end{aligned} \quad (8\text{-}3)$$

If, in expression (8-2), $$G_2(\omega)/G_1(\omega) = G_3(\omega) \cdot G_4(\omega), \quad (8\text{-}4)$$

then, $$G(\omega) = G_1(\omega) \cdot G_3(\omega). \quad (8\text{-}5)$$

That is, the irregularity which is caused in the frequency characteristic when the phase is shifted or the time is delayed with the sound reflected from the wall or the like can be eliminated. In other words, the term $G(\tau)$ can be eliminated.

In expression (8-1), $G(\tau)$ and $G(k)$ correspond to a time delay part and an attenuation part due to reflection in the reflected wave. In order to allow $G(\tau)$ and $G(k)$ to satisfy expression (8-2), $G(\tau)$ can be obtained by a method in which a delay element such as CCD is used to set the delay time, which is determined according to the reflectivity of a wall or the like, and $G(k)$ can be obtained using an attenuator because it is equivalent with the level attenuation which is due to the reflection.

In a sound field in a relatively narrow room such as that in a vehicle, sound waves are reflected in an intricate manner. However, if, depending on the conditions of the sound field, a low-pass filter, a high-pass filter, or a band-pass filter is inserted in the feedback loop to vary the transfer characteristics thereof, then the intricate spatial transfer characteristic can be corrected.

Figure 27:
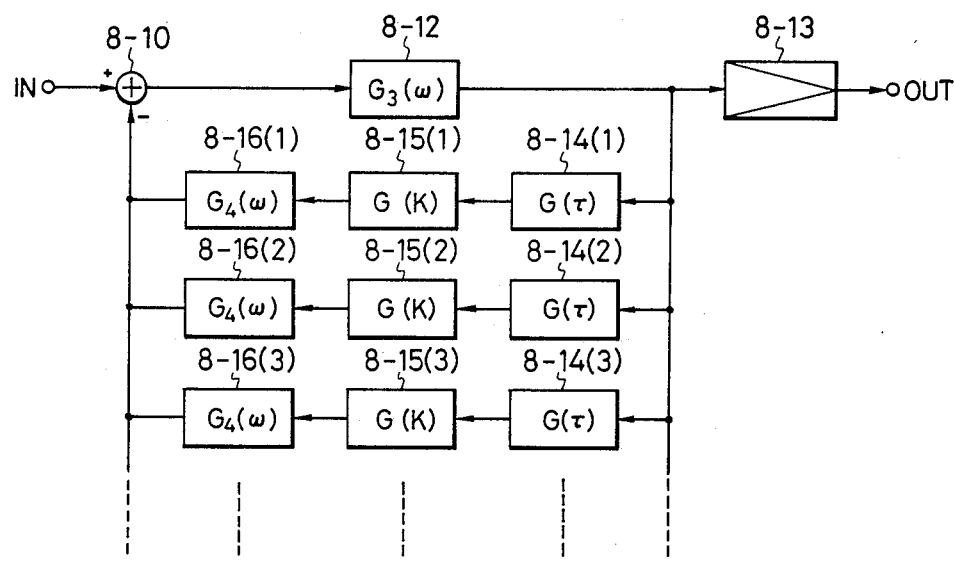

In the above-described embodiment, only one reflected sound wave is taken into account. However, in practice, there are a plurality of reflected sound waves in the sound field. Therefore, a plurality of feedback loops are provided as shown in FIG. 27. In this case, the transfer characteristics $G(\tau)$ of delay units 8-14(1) through 8-14(n) and the transfer characteristics $G(k)$ of level adjusting units 8-15(1) through 8-15(n) are suitably determined so that the effects of the plurality of reflections sounds are eliminated.

Figure 5:
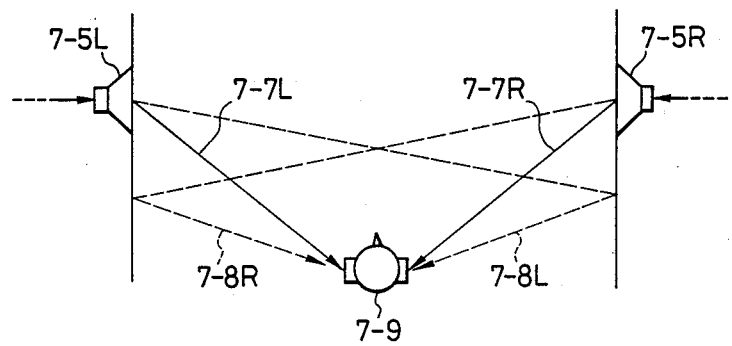
FIG. 5 is a diagram showing a conventional acoustic reproducing system in which sound waves reach a listener's ears reflected from walls on both sides.
Figure 28:
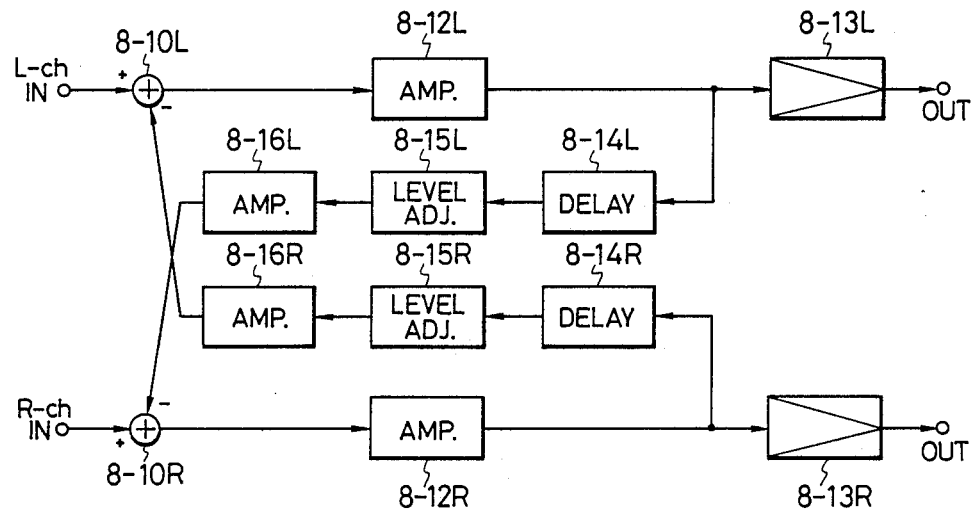

In a sound field such as that shown in FIG. 5, a sound field correcting system as shown in FIG. 28 may be employed. In this system, a signal in one of two channels is applied to the subtraction input terminal of a subtractor in the other channel. More specifically, the output of a left channel amplifier 8-12L is applied through a delay unit 8-14, a level adjusting unit 8-15L, and an amplifier 8-16L to the subtraction input terminal of a subtractor 8-10R, while the output of a right channel amplifier 8-12R is applied through a delay unit 8-14R, a level adjusting unit 8-15R and an amplifier 8-16R to the subtraction input terminal of a subtractor 8-10L.

Figure 29:
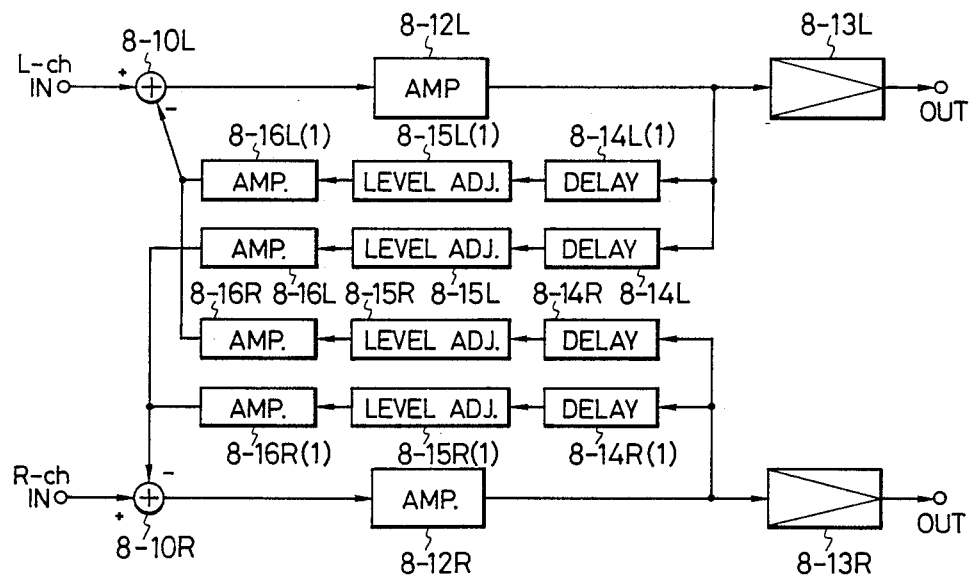

In a sound field, as shown in FIG. 24, defined by right and left walls and by a front wall located in front of listener's head, reflected sound waves reflected from the front wall reach the right and left ears of the listener. The effects of these sounds can be eliminated by using a sound field correcting system as shown in FIG. 29. In FIG. 29, those components which have been described with reference to FIG. 27 are therefore designated by the same reference numerals.

The sound field correcting system shown in FIG. 29 can be obtained by adding a series circuit of a delay unit 8-14L(1), a level adjusting unit 8-15(1) and an amplifier 8-16L(1), and a series circuit of a delay unit 8-14R(1), a level adjusting unit 8-15R(1) and an amplifier 8-16R(1) to the system shown in FIG. 27 in such a manner that the output of the series circuit for left channel is applied to a left channel subtractor 8-10L while the output of the series circuit for right channel is applied to a right channel subtractor 8-10R.

In the sound field correcting systems shown in FIGS. 27 and 29, the characteristic of each delay unit is determined so as to be a function of the difference in length between the direct wave and the reflected wave, and the characteristic of each level adjusting unit is also so determined so as to be function of the length of path of the reflected wave and the reflection factor of the wall.

According to the invention, a feedback loop whose characteristic is opposite to the acoustic transfer characteristic between the loudspeaker and the listening point is inserted between the signal source and the loudspeaker, and the phase and level characteristics of the loop are set as required to eliminate the interference of the reflected wave. Therefore, the frequency characteristic at the listening point is flat.

We claim:

1. A sound field correcting system for correcting a sound field formed by a combination of at least one direct sound wave radiated directly from at least a first loudspeaker and traveling a first distance to reach a listener and at least one reflected sound wave, also radiated from said at least said first loudspeaker and traveling a second, longer distance to reach said listener, said sound field correcting system comprising:

delay means for delaying an original signal which is an electrical equivalent of said direct sound wave to provide a delayed signal as a function of said first and second distances;

a high-pass filter for receiving said delayed signal and altering a frequency characteristic of said delayed signal to produce a filtered signal;

level adjusting means for receiving said filtered signal and adjusting its level to produce an output signal which is an electrical equivalent of said reflected sound wave; and first adding means for superposing the output signal of said adjusting means on said original signal to obtain a first corrected signal for eliminating an effect of said at least one reflected sound wave at a predetermined listening point in said sound field, said superposing of said output signal of said adjusting means boosting a low frequency characteristic of said first corrected signal.

2. A sound field correcting system as claimed in claim 1, wherein said high-pass filter has a variable frequency characteristic.

* * * * *